(12) United States Patent
Saiki et al.

(10) Patent No.: US 7,321,151 B2
(45) Date of Patent: Jan. 22, 2008

(54) SEMICONDUCTOR DEVICE AND METHOD OF FABRICATING THE SAME

(75) Inventors: Takashi Saiki, Kawasaki (JP);
Hiroyuki Ohta, Kawasaki (JP);
Hiroyuki Kanata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/800,749

(22) Filed: Mar. 16, 2004

(65) Prior Publication Data

US 2005/0095765 A1    May 5, 2005

(30) Foreign Application Priority Data

Oct. 31, 2003    (JP)    ............................ 2003-373499

(51) Int. Cl.
*H01L 29/76* (2006.01)

(52) U.S. Cl. ............... 257/336; 257/408; 257/E29.278; 438/306; 438/E21.435

(58) Field of Classification Search ................ 257/408, 257/549, 500, 336–338, 344–346, 335, 371; 438/163, 185, 371–375, 303, 306
See application file for complete search history.

(56) References Cited

U.S. PATENT DOCUMENTS 5,903,029 A * 5/1999 Hayashida et al. ......... 257/344
6,207,519 B1 * 3/2001 Kim et al. .................. 438/303
6,274,906 B1 * 8/2001 Kim et al. .................. 257/336
6,555,439 B1 * 4/2003 Xiang et al. ............... 438/305
2003/0146458 A1    8/2003 Horiuchi et al.
2004/0266122 A1 * 12/2004 Cheng et al. ............... 438/305

FOREIGN PATENT DOCUMENTS

| JP | 10-125916 A | 5/1998 |
| JP | 2003-229568 A | 8/2003 |
| JP | 2004-342908 A | 12/2004 |

OTHER PUBLICATIONS

Patent Abstracts of Japan, Publication No. 61018176, dated Jan. 27, 1986.
Patent Abstracts of Japan, Publication No. 11186188, dated Jul. 9, 1999.
Office Action dated May 1, 2007, issued in corresponding Japanese Appl. No. 2003-373499.

* cited by examiner

*Primary Examiner*—Quoc Hoang
(74) *Attorney, Agent, or Firm*—Westerman, Hattori, Daniels & Adrian, LLP.

(57) ABSTRACT

An extension region is formed by ion implantation under masking by a gate electrode, and then a substance having a diffusion suppressive function over an impurity contained in a source-and-drain is implanted under masking by the gate electrode and a first sidewall spacer so as to form amorphous layers a semiconductor substrate within a surficial layer thereof and in alignment with the first sidewall spacer, to thereby form an amorphous diffusion suppressive region.

18 Claims, 7 Drawing Sheets

FIG. 1A

PRIOR ART

NMOS         PMOS

FIG. 5B

NMOS         PMOS

SEMICONDUCTOR DEVICE AND METHOD OF FABRICATING THE SAME

CROSS-REFERENCE TO RELATED APPLICATIONS

This application is based upon and claims the benefit of priority from the prior Japanese Patent Application No. 2003-373499, filed on Oct. 31, 2003, the entire contents of which are incorporated herein by reference.

BACKGROUND OF THE INVENTION

1. Field of the Invention

The present invention relates to a semiconductor device having a gate and source-and-drain, and a method of fabricating the semiconductor device.

2. Description of the Related Art

There is a still further need for micronization of recent semiconductor devices, where efforts have been made typically on a MOS transistor, having an extension structure, in order to make a deep-junction, source-and-drain more shallower.

More specifically, one known technique for forming an n-type MOS transistor is such as implanting arsenic (As) ion, under masking by the gate electrode and sidewall spacer, so as to form amorphous layers the surface of a semiconductor substrate, and then implanting phosphorus (P) ion to the amorphous portion through the same masks, to thereby form an n-type source-and drain (see Patent Document 1). Another known technique for forming a p-type MOS transistor is such as implanting silicon (Si) ion, under masking by the gate electrode and sidewall spacer, so as to form amorphous laysers the surface of a semiconductor substrate, and then implanting boron (B) ion to the amorphous portion through the same masks, to thereby form a p-type source-and-drain (see Patent Document 2).

[Patent Document 1]
Japanese Patent Application Laid-Open No. Hei 11-186188

[Patent Document 2]
Japanese Patent Application Laid-Open No. Sho 61-018176

The above-described techniques should surely be successful in making the junction relatively shallower by preliminarily forming amorphous laysers the area where the source-and-drain region is to be formed later. Demands for suppressing lateral diffusion of the impurity contained in the source-and-drain are, however, becoming severer as the micronization of the semiconductor device further advances, and it is also necessary to fulfill requirements for higher performances as well as those for micronization. First, a deep-junction, source-and-drain region must be kept at a certain degree of depth in order to reduce the junction leakage. In addition, the source-and-drain must have a higher impurity concentration in order to reduce the contact resistance and sheet resistance. This inevitably enhances the lateral diffusion, and raises a problem in that the impurity can readily reach the extension region to thereby degrade the roll-off characteristics.

The present invention is conceived after considering the above-described problems, and an object thereof resides in providing a highly-reliable semiconductor device capable of exactly suppressing the lateral diffusion of the source-and-drain, fulfilling the requirements for further micronization and more advanced performances, and a method of fabricating such semiconductor device.

SUMMARY OF THE INVENTION

A semiconductor device of the present invention comprises a gate formed over a semiconductor region while placing an insulating film in between; a first impurity-diffused region formed, as being aligned with the gate, in the surficial layer of the semiconductor region; a second impurity-diffused region formed, as being distant from the gate while placing a portion of a side of the first impurity-diffused region in between; and a third impurity-diffused region formed, as being distant from the gate while placing the portion of the side of the first impurity-diffused region and a portion of a side of the second impurity-diffused region in between; wherein the second impurity-diffused region is formed as containing a diffusion suppressive element for suppressing diffusion of an impurity contained in the third impurity-diffused region.

A method of fabricating a semiconductor device of the present invention comprises the steps of forming a gate over a semiconductor region while placing an insulating film in between: forming a first impurity-diffused region by introducing an impurity into a surficial layer of the semiconductor region under masking by the gate; forming a first sidewall spacer over both lateral faces of the gate; forming an amorphous second impurity-diffused region by introducing a diffusion suppressive element into the surficial layer of the semiconductor region under masking by the gate and the first sidewall spacer; forming a second sidewall spacer to cover the first sidewall spacer over both lateral sides of the gate; and forming a third impurity-diffused region by introducing an impurity into the surficial layer of the semiconductor region to a depth larger than that of the first impurity-diffused region under masking by the gate, the first sidewall spacer and the second sidewall spacer.

DETAILED DESCRIPTION OF THE PREFERRED EMBODIMENTS

Basic Concept of the Present Invention

First, a basic concept of the present invention will be explained.

For the purpose of exactly suppressing the lateral diffusion of a deep-junction, source-and-drain while ensuring its depth to a proper degree so as to secure a large impurity concentration, the present inventors reached an idea of disposing a diffusion suppressive region (second region) between the extension region (first region) and the source-and-drain (third region) so as to keep their edges distant from each other.

Figure 1A:
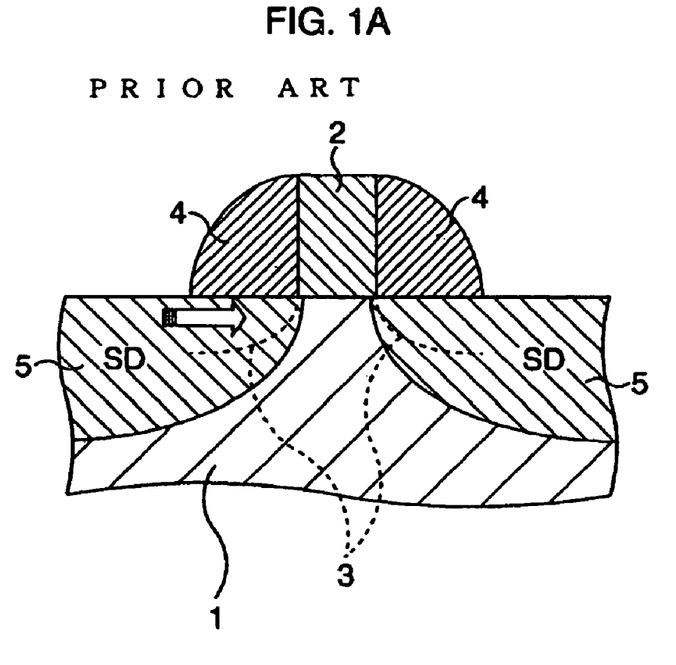
FIGS. 1A and 1B are schematic sectional views for explaining basic configurations of the present invention in comparison with a conventional structure.

In a conventional MOS transistor, as shown in FIG. 1A, an extension region 3 is formed by ion implantation under masking by a gate electrode 2 formed on a semiconductor region, which is a semiconductor substrate 1 herein, and thereafter a source-and-drain 5 is formed by ion implantation under masking by the gate electrode 2 and a first sidewall spacer 4, where the lateral diffusion of the impurity from the source-and-drain 5 tends to occur as indicated by arrow "A" in the drawing.

Figure 1B:
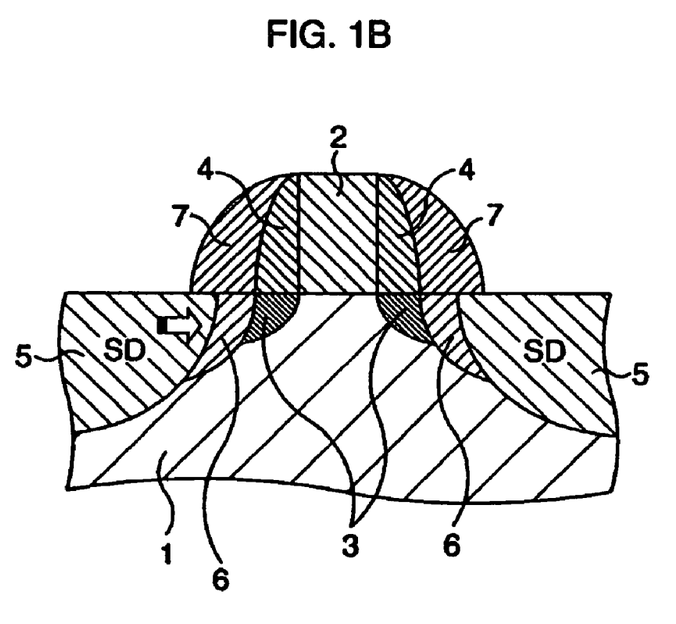

In contrast to this, a MOS transistor of the present invention is fabricated, as shown in FIG. 1B, by forming the extension region 3 by ion implantation under masking by the gate electrode 2, and thereafter a substance having a diffusion suppressive function (diffusion suppressive element) over the impurity contained in the source-and-drain 5 is introduced by ion implantation under masking by the gate electrode 2 and the first sidewall spacer 4, so as to form amorphous laysers the semiconductor substrate 1 within a surficial layer thereof and in alignment with the first sidewall spacer 4, to thereby form an amorphous diffusion suppressive region 6. Thereafter, the source-and-drain 5 is formed in a portion of the surficial layer in alignment with a second sidewall spacer 7, under masking by the gate electrode 2, first sidewall spacer 4 and second sidewall spacer 7.

The diffusion suppressive element is at least any one element selected from arsenic (As), germanium (Ge), nitrogen (N), fluorine (F) and carbon (C) for the case where the impurity contained in the extension region 3 and the source-and-drain 5 is an n-type impurity; and is at least any one element selected from germanium (Ge), nitrogen (N), fluorine (F), carbon (C) and indium (In) for the case where the impurity contained in the extension region 3 and the source-and-drain 5 is a p-type impurity.

In this way, the extension region 3 and source-and-drain 5 are kept distant from each other by the diffusion suppressive region 6, and the lateral diffusion of the impurity from the source-and-drain 5 is completely blocked by the diffusion suppressive region 6. It is thus made possible to reduce the junction leakage, contact resistance and sheet resistance even if the source-and-drain is formed so as to have a relatively large depth and impurity concentration to thereby prevent the roll-off characteristic from degrading, and to realize further micronization and higher performances of the MOS transistor.

Specific Embodiment of the Present Invention

A specific embodiment of the present invention will be detailed hereinafter referring to the attached drawings. A CMOS transistor is exemplified herein as the semiconductor device, and the configuration thereof, together with a method of fabrication, will be described for the convenience sake.

FIGS. 2A to 5B are schematic sectional views sequentially showing process steps of a method of fabricating the CMOS transistor of the present embodiment.

Figure 2A:
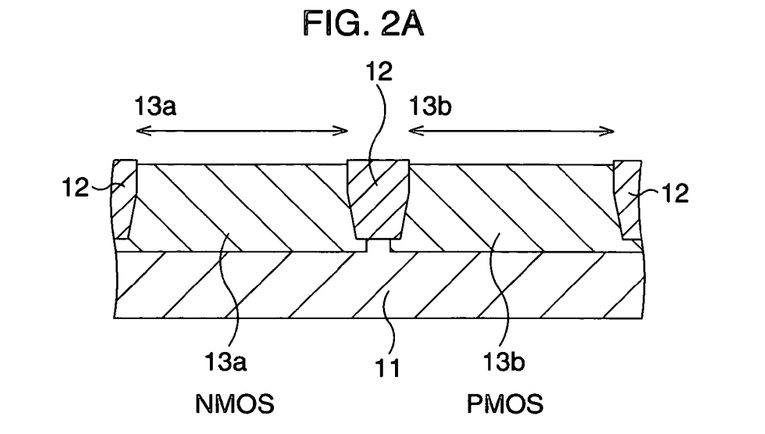
FIGS. 2A to 2C are schematic sectional views sequentially showing process steps of a method of fabricating a CMOS transistor of the present embodiment.

First as shown in FIG. 2A, an element isolation structure 12 is formed in the element isolation region of a p-type silicon semiconductor substrate 11 by the STI (shallow trench isolation) process, in which grooves herein are formed as the element isolation structure and are then filled with an insulating material, to thereby define active regions 13a, 13b. The active region 13a herein serves as a formation region for an nMOS transistor, and the active region 13b serves as a formation region for a pMOS transistor. The active regions 13a and 13b are then implanted with a p-type impurity and an n-type impurity, respectively, to thereby form a p-type well 14a and an n-type well 14b.

Figure 2B:
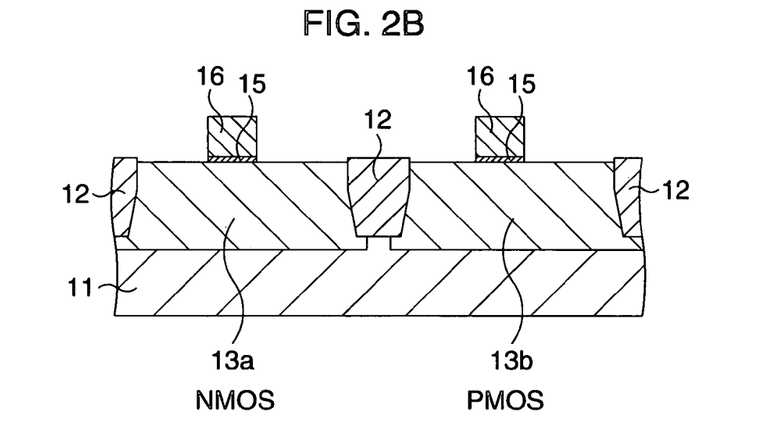

Next, as shown in FIG. 2B, a gate insulating film 15 composed of silicon oxynitrides is formed by the thermal nitridation on the surface of the p-type well 14a and n-type well 14b, a polysilicon film is deposited thereon by the CVD process, and the polysilicon film (together with the gate insulating film 15) is then patterned by photolithography and succeeding dry etching, to thereby form a gate electrode 16. The gate insulating film 15 herein may be composed of silicon oxide.

Figure 2C:
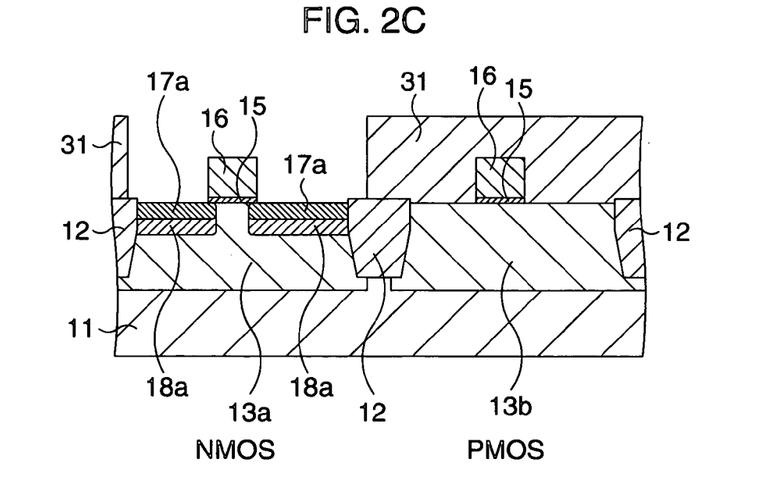

Next, an extension region and a pocket region are formed in the active region 13a.

More specifically, as shown in FIG. 2C, the active region 13b is covered with a photo-resist 31, and an n-type impurity, which is arsenic (As) herein, is implanted into the surficial layer of the active region 13a, under masking by the gate electrode 16 and the photo-resist 31, and under conditions of an ion acceleration energy of 1 keV to 5 keV, a dose of $5 \times 10^{14}/cm^2$ to $2 \times 10^{15}/cm^2$ and an angle of inclination (an angle away from the normal line on the substrate surface) of 0°, to thereby form an extension region 17a.

Next, a p-type impurity, which is indium (In) herein, is implanted into the surficial layer of the active region 13a, similarly under masking by the gate electrode 16 and the photo-resist 31, and under conditions of an ion acceleration energy of 30 keV to 100 keV, a dose of $5 \times 10^{12}/cm^2$ to $1.5 \times 10^{13}/cm^2$ and an angle of inclination of 0° to 45° from four directions (4 times of ion implantation), to thereby form a pocket region 18a. The photo-resist 31 is thereafter removed typically by ashing.

Figure 3A:
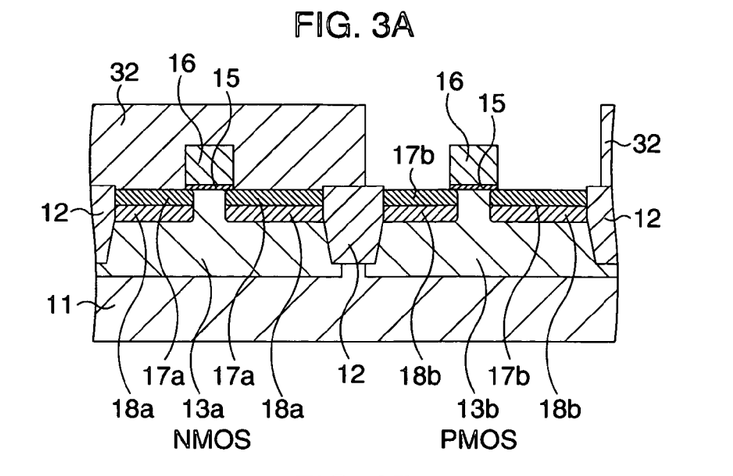
FIGS. 3A to 3C are schematic sectional views sequentially showing process steps of the method of fabricating a CMOS transistor of the present embodiment as continued from FIG. 2C.

Next, the extension region and the pocket region are formed also in the active region 13b.

More specifically, as shown in FIG. 3A, the active region 13a is covered with a photo-resist 32, and a p-type impurity, which is boron (B) herein, is implanted into the surficial layer of the active region 13b, under masking by the gate electrode 16 and the photo-resist 32, and under conditions of an ion acceleration energy of 0.1 keV to 1 keV, a dose of $5 \times 10^{14}/cm^2$ to $2 \times 10^{15}/cm^2$ and an angle of inclination of 0°, to thereby form an extension region 17b.

Next, an n-type impurity, which is antimony (Sb) herein, is implanted into the surficial layer of the active region 13b, similarly under masking by the gate electrode 16 and the photo-resist 32, and under conditions of an ion acceleration energy of 30 keV to 100 keV, a dose of $5 \times 10^{12}/cm^2$ to $1.5 \times 10^{13}/cm^2$ and an angle of inclination of 0° to 45° from four directions (4 times of ion implantation), to thereby form a pocket region 18b. The photo-resist 32 is thereafter removed typically by ashing.

Figure 3B:
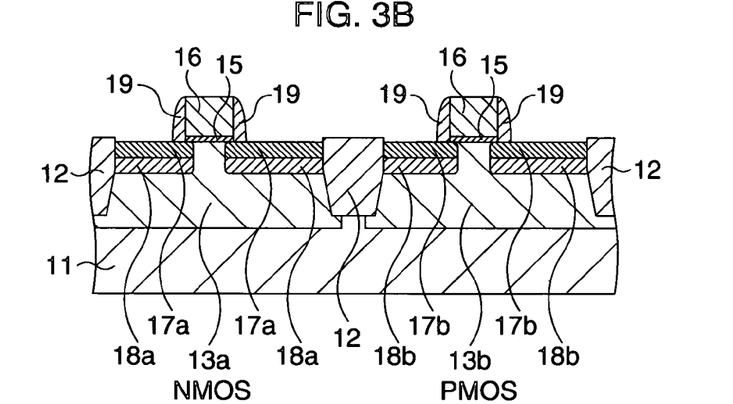

Next, as shown in FIG. 3B, a silicon oxide film is deposited over the entire surface of the semiconductor substrate 1 including the active regions 13a, 13b, and the entire surface of the silicon oxide film is then anisotropically etched (etchback) so as to leave the silicon oxide film only on both lateral faces of the gate electrode 16, to thereby form a first sidewall spacer 19 to a thickness of approximately 10 nm to 50 nm. The insulating film composing the first sidewall spacer 19 herein is preferably composed of a material formed under a temperature condition not causative of diffusion of the impurity contained in the previously-formed extension regions 17a, 17b and the pocket regions 18a, 18b, and is preferably formed at the same temperature. More specifically, BTBAS (bis-tertiary-butylaminosilane) and oxygen can typically be used, where the silicon oxide film is formed by the thermal CVD process at a filming temperature ranging from 500° C. to 580° C., and a filming time ranging from 5 minutes to 20 minutes.

Figure 3C:
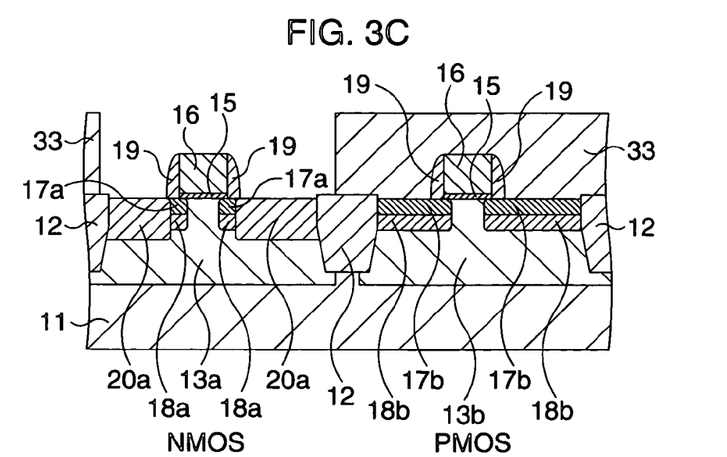

Next, the diffusion suppressive region is formed in the active region 13a.

More specifically, as shown in FIG. 3C, the active region 13b is covered with a photo-resist 33, and a diffusion suppressive element, which is arsenic (As) herein, is implanted into the surficial layer of the active region 13a, under masking by the gate electrode 16, the first sidewall spacer 19 and the photo-resist 33, and under conditions of an ion acceleration energy of 3 keV to 15 keV, a dose of $5 \times 10^{14}/cm^2$ to $3 \times 10^{15}/cm^2$ and an angle of inclination of 0°, to thereby form an amorphous diffusion suppressive region 20a. The photo-resist 33 is thereafter removed typically by ashing.

Figure 4A:
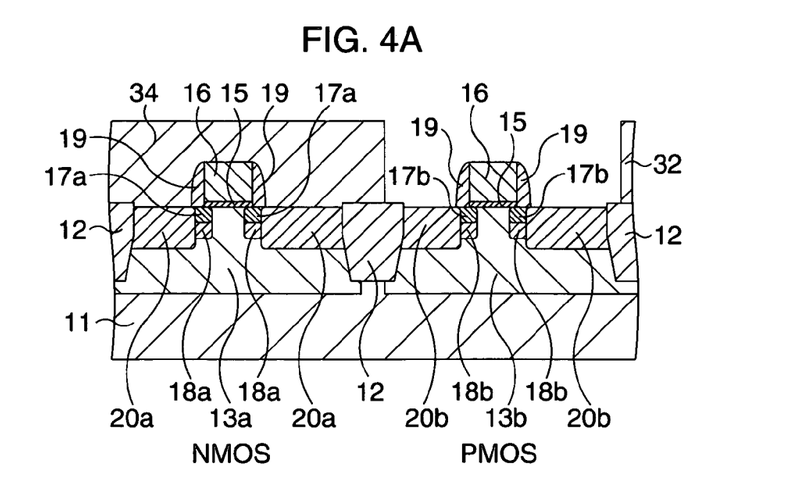
FIGS. 4A to 4C are schematic sectional views sequentially showing process steps of the method of fabricating a CMOS transistor of the present embodiment as continued from FIG. 3C.

Next, the diffusion suppressive region is formed also in the active region 13b.

More specifically, as shown in FIG. 4A, the active region 13a is covered with a photo-resist 34, and a diffusion suppressive element, which is germanium (Ge) herein, is implanted into the surficial layer of the active region 13b, under masking by the gate electrode 16, the first sidewall spacer 19 and the photo-resist 34, and under conditions of an ion acceleration energy of 3 keV to 15 keV, a dose of $5 \times 10^{14}/cm^2$ to $3 \times 10^{15}/cm^2$ and an angle of inclination of 0°, to thereby form an amorphous diffusion suppressive region 20b. It is also allowable herein to implant p-type impurity ion such as boron(B) in addition to Ge. The photo-resist 34 is thereafter removed typically by ashing.

Figure 4B:
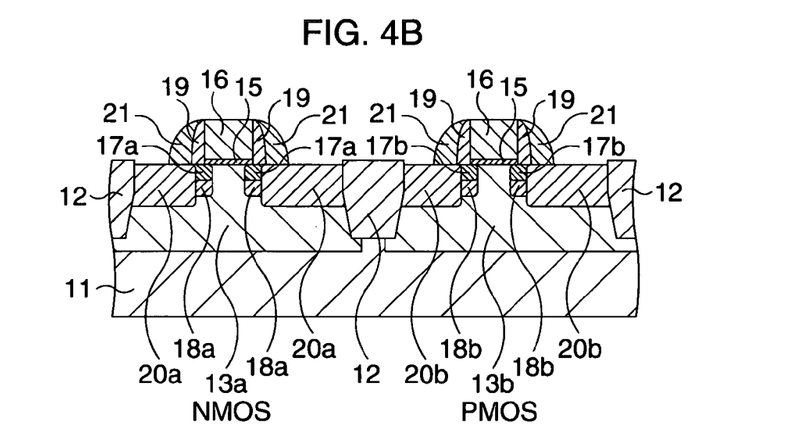

Next, as shown in FIG. 4B, a silicon oxide film is deposited over the entire surface of the semiconductor substrate 1 including the active regions 13a, 13b, and the entire surface of the silicon oxide film is then anisotropically etched (etchback) so as to leave the silicon oxide film only on both lateral faces of the gate electrode 16 and so as to cover the first sidewall spacer 19, to thereby form a second sidewall spacer 21 to a thickness of approximately 50 nm to 100 nm. The insulating film composing the second sidewall spacer 21 herein is preferably composed of a material formed under a temperature condition not causative of re-crystallization of the previously-formed diffusion suppressive regions 20a, 20b, and is preferably formed at the same temperature. More specifically, BTBAS (bis-tertiary-butylaminosilane) and oxygen can typically be used, where the silicon oxide film is formed by the thermal CVD process at a filming temperature ranging from 500° C. to 580° C., and a filming time ranging from 5 minutes to 20 minutes.

Figure 4C:
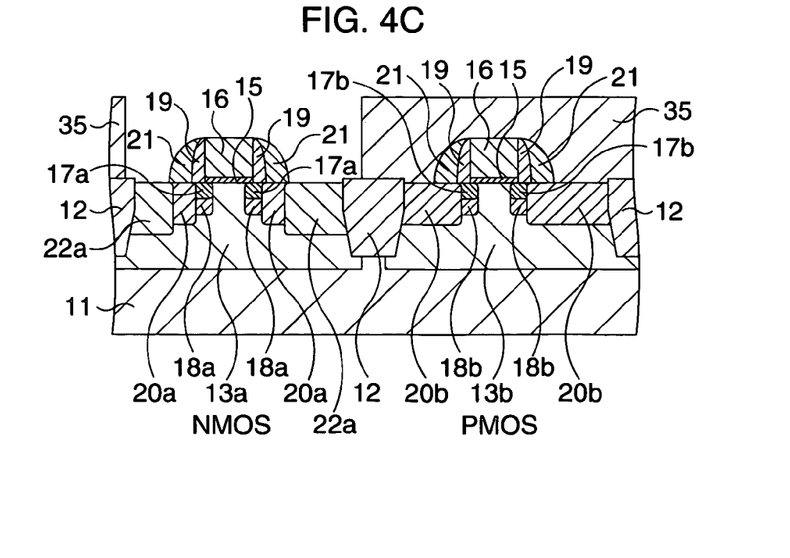

Next, the source-and-drain having a deep junction is formed in the active region 13a.

More specifically, as shown in FIG. 4C, the active region 13b is covered with a photo-resist 35, and an n-type impurity, which is phosphorus (P) herein, is implanted into the surficial layer of the active region 13b, under masking by the gate electrode 16, the first sidewall spacer 19, the second sidewall spacer 21 and the photo-resist 35, and under conditions of an ion acceleration energy of 4 keV to 10 keV, a dose of as large as $4 \times 10^{15}/cm^2$ to $1.5 \times 10^{16}/cm^2$ and an angle of inclination of 0°, to thereby form a source-and-drain 22a. It is also allowable herein to implant germanium (Ge) for example before the P implantation. The photo-resist 35 is thereafter removed typically by ashing.

Figure 5A:
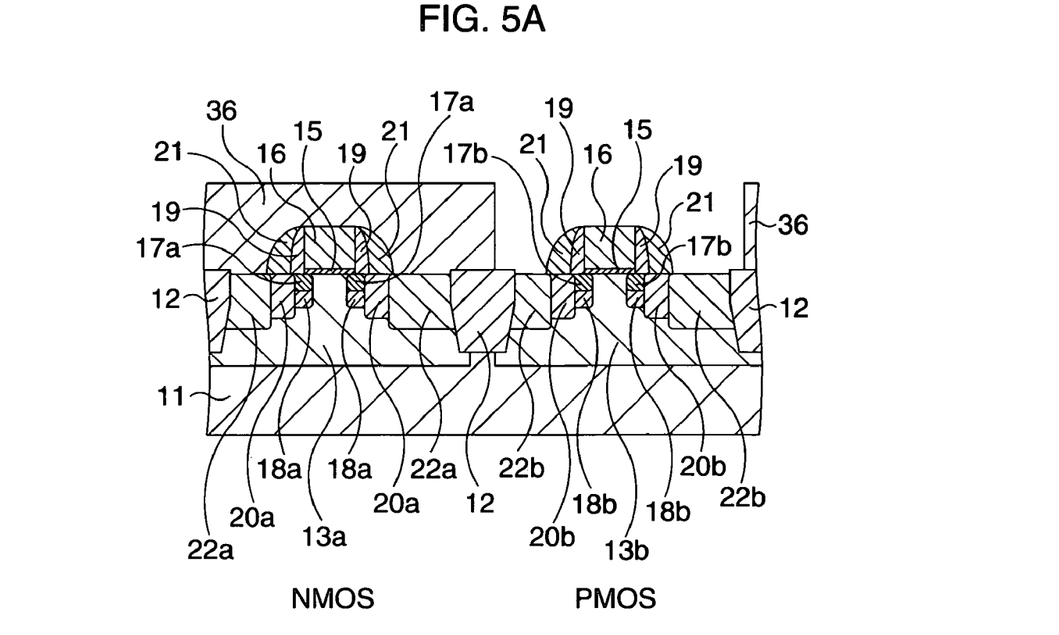
FIGS. 5A and 5B are schematic sectional views sequentially showing process steps of the method of fabricating a CMOS transistor of the present embodiment as continued from FIG. 4C.

Next, the source-and-drain having a deep junction is formed also in the active region 13b.

More specifically, as shown in FIG. 5A, the active region 13a is covered with a photo-resist 36, and a p-type impurity, which is boron (B) herein, is implanted into the surficial layer of the active region 13b, under masking by the gate electrode 16, the first sidewall spacer 19, the second sidewall spacer 21 and the photo-resist 36, and under conditions of an ion acceleration energy of 2 keV to 5 keV, a dose of as large as $4 \times 10^{15}/cm^2$ to $1.5 \times 10^{16}/cm^2$ and an angle of inclination of 0°, to thereby form a source-and-drain 22b. It is also allowable herein to implant germanium (Ge) for example before the B implantation. The photo-resist 36 is thereafter removed typically by ashing.

Next, spike annealing is carried out at 1000° C. to 1070° C. in an $N_2$ atmosphere to thereby activate the n-type impurity and p-type impurity previously introduced.

Figure 5B:
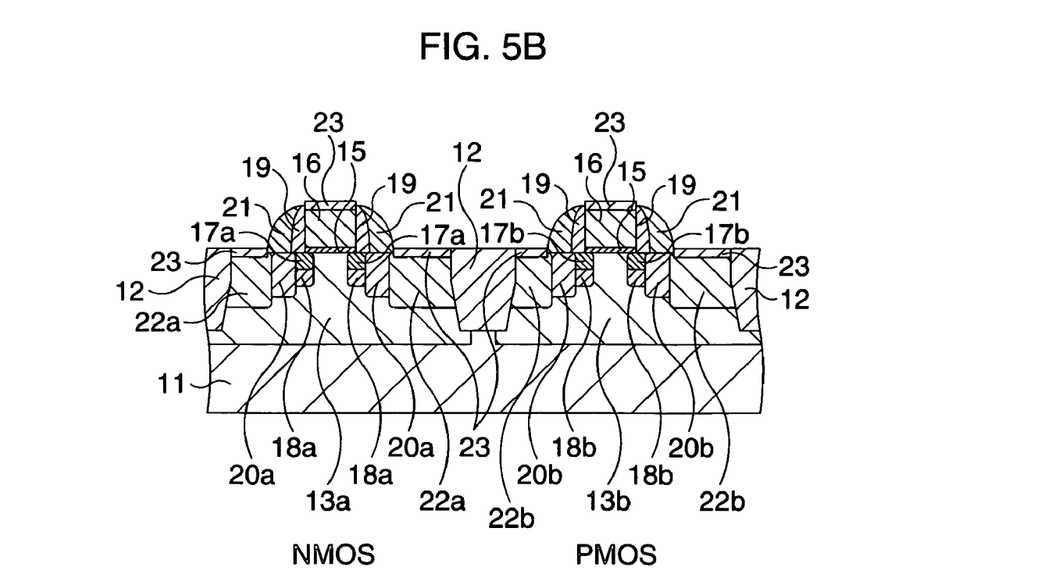

Next, as shown in FIG. 5B, a silicide-forming metal, which is Co or Ni for example, is deposited over the entire surface, and allowed the metal to react with silicon under annealing so as to proceed self-aligned silicidation (SALICIDE), to thereby form a silicide layer 23, which is composed of CoSi or NiSi for example, on the gate electrode 16 and source-and-drains 22a, 22b. Unreacted residue of the silicide-forming metal is then removed.

A MOS transistor is finished after formation of an inter-layer insulating film covering the entire surface, and various wiring processes.

Using thus-fabricated MOS transistor having a gate length of 40 nm, various transistor characteristics were examined. Results are described below.

Figure 6:
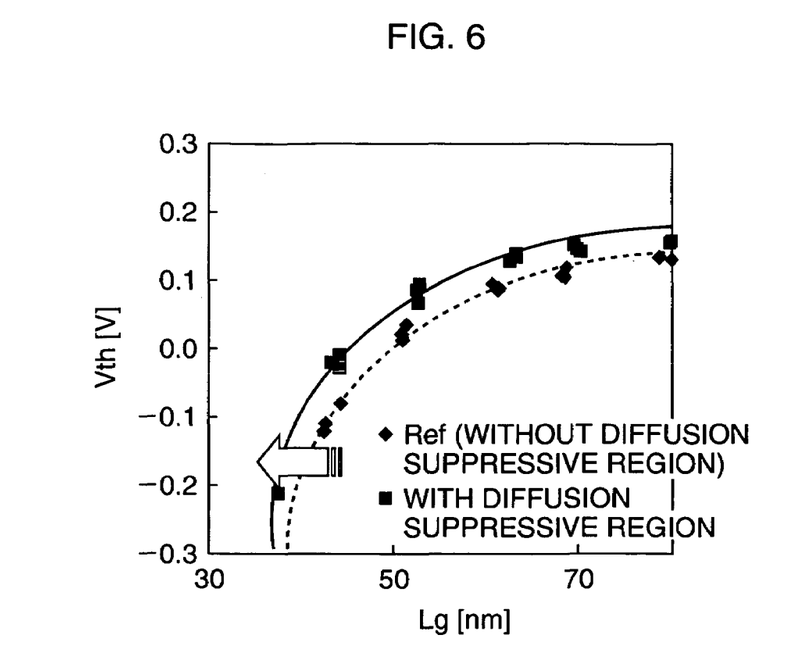
FIG. 6 is a graph showing roll-off characteristics expressed by relations between gate length $L_g$ and threshold voltage.
Figure 7:
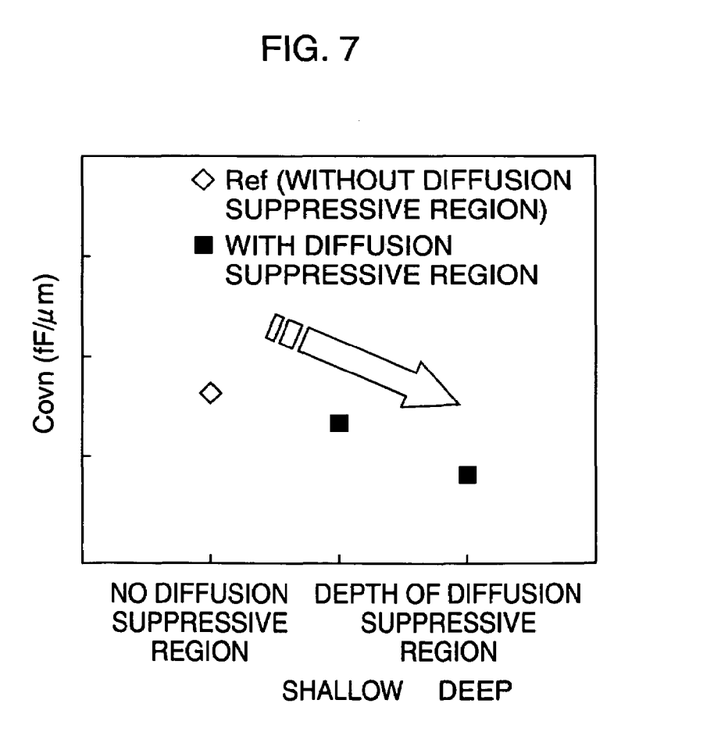
FIG. 7 is a graph showing $C_{ov}$ characteristics expressed by relations between depth of diffusion suppressive region and $C_{ovn}$.
Figure 8:
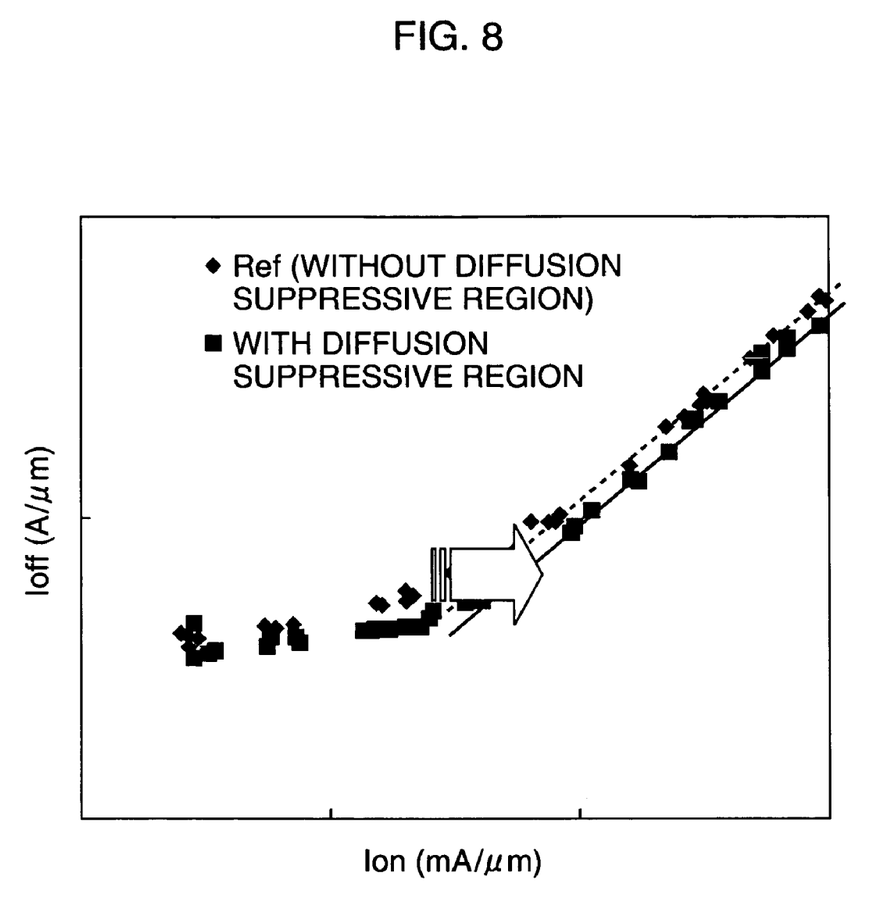
FIG. 8 is a graph showing $I_{on}$-$I_{off}$ characteristics expressed by relations between ON current ($I_{on}$) and OFF current ($I_{off}$).

FIG. 6 shows roll-off characteristics expressed by relations between gate length $L_g$ and threshold voltage; FIG. 7 shows $C_{ov}$ characteristics expressed by relations between depth of diffusion suppressive region and $C_{ovn}$; and FIG. 8 shows $I_{on}$-$I_{off}$ characteristics expressed by relations between ON current ($I_{on}$) and OFF current ($I_{off}$). It is obvious that adoption of the diffusion suppressive region is successful in improving the roll-off characteristics, and in improving the drive current through reduction in $C_{ov}$ and parasitic resistance right under the second sidewall spacer.

The present invention is successful in exactly suppressing lateral diffusion of the source-and-drain, fulfilling further demands for micronization and advanced performances, and consequently realizing a highly-reliable semiconductor device.

What is claimed is:
1. A semiconductor device comprising:
    a gate formed over a semiconductor region while placing an insulating film in between;
    a first impurity-diffused region formed, as being aligned with said gate, in the surficial layer of said semiconductor region;
    a second impurity-diffused region formed, as being distant from said gate while placing a portion of a side of said first impurity-diffused region in between; and a third impurity-diffused region formed, as being distant from said gate while placing said portion of said side of said first impurity-diffused region and a portion of a side of said second impurity-diffused region in between;

wherein said third impurity-diffused region has a higher impurity-concentration than said second impurity-diffused region;

wherein said second impurity-diffused region is formed as containing a diffusion suppressive element for suppressing diffusion of an impurity contained in said third impurity-diffused region;

wherein said third impurity-diffused region is formed deeper than said second impurity-diffused region;

wherein said diffusion suppressive element is at least any one element selected from germanium, nitrogen, fluorine and carbon for the case where said impurity contained in said first and third impurity-diffused regions is an n-type impurity.

2. The semiconductor device according to claim 1, further comprising:

a first sidewall spacer formed over both lateral faces of said gate; and a second sidewall spacer formed to cover said first sidewall spacer over both lateral sides of said gate;

wherein said second impurity-diffused region is formed as being aligned with said second sidewall spacer, and said third impurity-diffused region is formed as being aligned with said first sidewall spacer.

3. The semiconductor device according to claim 1, further comprising a fourth impurity-diffused region formed, in the surficial layer of said semiconductor region, as being aligned with said gate and as containing an impurity having a conductivity type opposite to that of impurities contained in said first and third impurity-diffused regions.

4. The semiconductor device according to claim 1, wherein said third impurity-diffused region has a higher impurity-concentration than said first impurity-diffused region.

5. A semiconductor device comprising:

a gate formed over a semiconductor region while placing an insulating film in between;

a first impurity-diffused region formed, as being aligned with said gate, in the surficial layer of said semiconductor region;

a second impurity-diffused region formed, as being distant from said gate while placing a portion of a side of said first impurity-diffused region in between; and a third impurity-diffused region formed, as being distant from said gate while placing said portion of said side of said first impurity-diffused region and a portion of a side of said second impurity-diffused region in between;

wherein said third impurity-diffused region has a higher impurity-concentration than said second impurity-diffused region;

wherein said second impurity-diffused region is formed as containing a diffusion suppressive element for suppressing diffusion of an impurity contained in said third impurity-diffused region;

wherein said diffusion suppressive element is at least any one element selected from germanium, nitrogen, fluorine and carbon for the case where said impurity contained in said first and third impurity-diffused regions is an n-type impurity.

6. The semiconductor device according to claim 5, further comprising:

a first sidewall spacer formed over both lateral faces of said gate; and a second sidewall spacer formed to cover said first sidewall spacer over both lateral sides of said gate;

wherein said second impurity-diffused region is formed as being aligned with said first sidewall spacer, and said third impurity-diffused region is formed as being aligned with said second sidewall spacer.

7. The semiconductor device according to claim 5, further comprising a fourth impurity-diffused region formed, in the surficial layer of said semiconductor region, as being aligned with said gate and as containing an impurity having a conductivity type opposite to that of impurities contained in said first and third impurity-diffused regions.

8. The semiconductor device according to claim 5, wherein said diffusion suppressive element is at least any one element selected from germanium, nitrogen, fluorine, carbon and indium for the case where said impurity contained in said first and third impurity-diffused regions is a p-type impurity.

9. The semiconductor device according to claim 5, wherein said third impurity-diffused region has a higher impurity-concentration than said first impurity-diffused region.

10. A semiconductor device comprising:

a gate formed over a semiconductor region while placing an insulating film in between;

a first impurity-diffused region formed, as being aligned with said gate, in the surficial layer of said semiconductor region;

a second impurity-diffused region formed, as being distant from said gate while placing a portion of a side of said first impurity-diffused region in between; and a third impurity-diffused region formed, as being distant from said gate while placing said portion of said side of said first impurity-diffused region and a portion of a side of said second impurity-diffused region in between;

wherein said third impurity-diffused region has a higher impurity-concentration than said second impurity-diffused region;

wherein said second impurity-diffused region is formed as containing a diffusion suppressive element for suppressing diffusion of an impurity contained in said third impurity-diffused region;

wherein said diffusion suppressive element is at least any one element selected from germanium, nitrogen, fluorine and carbon for the case where said impurity contained in said first and third impurity-diffused regions is a p-type impurity.

11. The semiconductor device according to claim 10, further comprising:

a first sidewall spacer formed over both lateral faces of said gate; and a second sidewall spacer formed to cover said first sidewall spacer over both lateral sides of said gate;

wherein said second impurity-diffused region is formed as being aligned with said first sidewall spacer, and said third impurity-diffused region is formed as being aligned with said second sidewall spacer.

12. The semiconductor device according to claim 10, further comprising a fourth impurity-diffused region formed, in the surficial layer of said semiconductor region, as being aligned with said gate and as containing an impurity having a conductivity type opposite to that of impurities contained in said first and third impurity-diffused regions.

13. The semiconductor device according to claim 10, wherein said diffusion suppressive element is at least any one element selected from arsenic, germanium, nitrogen, fluorine and carbon for the case where said impurity contained in said first and third impurity-diffused regions is an n-type impurity.

14. The semiconductor device according to claim 10, wherein said third impurity-diffused region has a higher impurity-concentration than said first impurity-diffused region.

15. A semiconductor device comprising:
   a gate formed over a semiconductor region while placing an insulating film in between;
   a first impurity-diffused region formed, as being aligned with said gate, in the surficial layer of said semiconductor region;
   a second impurity-diffused region formed, as being distant from said gate while placing a portion of a side of said first impurity-diffused region in between; and
   a third impurity-diffused region formed, as being distant from said gate while placing said portion of said side of said first impurity-diffused region and a portion of a side of said second impurity-diffused region in between;
   wherein said third impurity-diffused region has a higher impurity-concentration than said second impurity-diffused region;
   wherein said second impurity-diffused region is formed as containing a diffusion suppressive element for suppressing diffusion of an impurity contained in said third impurity-diffused region;
   wherein said third impurity-diffused region is formed deeper than said second impurity-diffused region;
   wherein said diffusion suppressive element is at least any one element selected from germanium, nitrogen, fluorine, and carbon for the case where said impurity contained in said first and third impurity-diffused regions is a p-type impurity.

16. The semiconductor device according to claim 15, further comprising:
   a first sidewall spacer formed over both lateral faces of said gate; and
   a second sidewall spacer formed to cover said first sidewall spacer over both lateral sides of said gate;
   wherein said second impurity-diffused region is formed as being aligned with said first sidewall spacer, and said third impurity-diffused region is formed as being aligned with said second sidewall spacer.

17. The semiconductor device according to claim 15, further comprising a fourth impurity-diffused region formed, in the surficial layer of said semiconductor region, as being aligned with said gate and as containing an impurity having a conductivity type opposite to that of impurities contained in said first and third impurity-diffused regions.

18. The semiconductor device according to claim 15, wherein said third impurity-diffused region has a higher impurity-concentration than said first impurity-diffused region.

* * * * *

UNITED STATES PATENT AND TRADEMARK OFFICE
CERTIFICATE OF CORRECTION

PATENT NO.        : 7,321,151 B2
APPLICATION NO. : 10/800749
DATED             : January 22, 2008
INVENTOR(S)      : Takashi Saiki et al.

It is certified that error appears in the above-identified patent and that said Letters Patent is hereby corrected as shown below:

In Fig. 1B
Change
"

"

UNITED STATES PATENT AND TRADEMARK OFFICE
CERTIFICATE OF CORRECTION

PATENT NO. : 7,321,151 B2
APPLICATION NO. : 10/800749
DATED : January 22, 2008
INVENTOR(S) : Takashi Saiki et al.

Page 2 of 2

It is certified that error appears in the above-identified patent and that said Letters Patent is hereby corrected as shown below:

To be
--

FIG. 1B

--

Signed and Sealed this

Twenty-second Day of December, 2009

David J. Kappos
*Director of the United States Patent and Trademark Office*